United States Patent
Tsuji et al.

[11] Patent Number: 6,158,232
[45] Date of Patent: Dec. 12, 2000

[54] ADVANCED LIQUID COOLING APPARATUS

[75] Inventors: Kenichi Tsuji; Yoshihito Kikuchi; Naoto Mizuguchi, all of Tokyo, Japan

[73] Assignee: NEC Corporation, Tokyo, Japan

[21] Appl. No.: 09/266,220

[22] Filed: Mar. 10, 1999

[30]     Foreign Application Priority Data

Mar. 13, 1998   [JP]   Japan .................................. 10-061822

[51] Int. Cl.⁷ .................................................. F25D 23/12
[52] U.S. Cl. ........................ 62/259.2; 165/80.4; 361/699; 361/702
[58] Field of Search ......................... 62/259.2; 165/80.4, 165/80.5; 361/699, 702

[56]            References Cited

U.S. PATENT DOCUMENTS

| | | | |
|---|---|---|---|
| 4,392,362 | 7/1983 | Little | 62/259.2 |
| 4,938,280 | 7/1990 | Clark | 165/80.4 |
| 5,220,171 | 6/1993 | Hara et al. | 62/259.2 |
| 5,220,809 | 6/1993 | Voss | 62/259.2 |
| 5,453,911 | 9/1995 | Wolgemuth et al. | 165/80.4 |
| 5,901,036 | 5/1999 | Arz | 165/80.4 |

FOREIGN PATENT DOCUMENTS

| | | |
|---|---|---|
| 2715773 | 8/1995 | France . |
| 4322665 | 1/1994 | Germany . |
| 1230298 | 9/1989 | Japan . |
| 1286350 | 11/1989 | Japan . |
| 317696 | 2/1991 | Japan . |
| 494562 | 3/1992 | Japan . |
| 7285344 | 10/1995 | Japan . |
| 8056088 | 2/1996 | Japan . |
| 8082653 | 3/1996 | Japan . |
| 9715801 | 5/1997 | WIPO . |

*Primary Examiner*—Ronald Capossela
*Attorney, Agent, or Firm*—Ostrolenk, Faber, Gerb & Soffen, LLP

[57]            ABSTRACT

An advanced liquid cooling system with an advanced cooling characteristic and high reliability, which is small in size and light in weight, is provided. In the liquid cooling system, heating units 2, which are semiconductors, are fixed on a base having high thermal conductivity. A liquid-passage hole 7 in the base 5 allows a liquid refrigerant 6 to pass through. Since the base 5 is made of material with high thermal conductivity, and the liquid-passage hole 7 extends in the vicinity of the heating unit 2 in the base, it is sufficient to transfer the heat of heating unit 2 the liquid refrigerant 6. This enables control of the temperature rise of the heating unit to be maintained low.

10 Claims, 8 Drawing Sheets

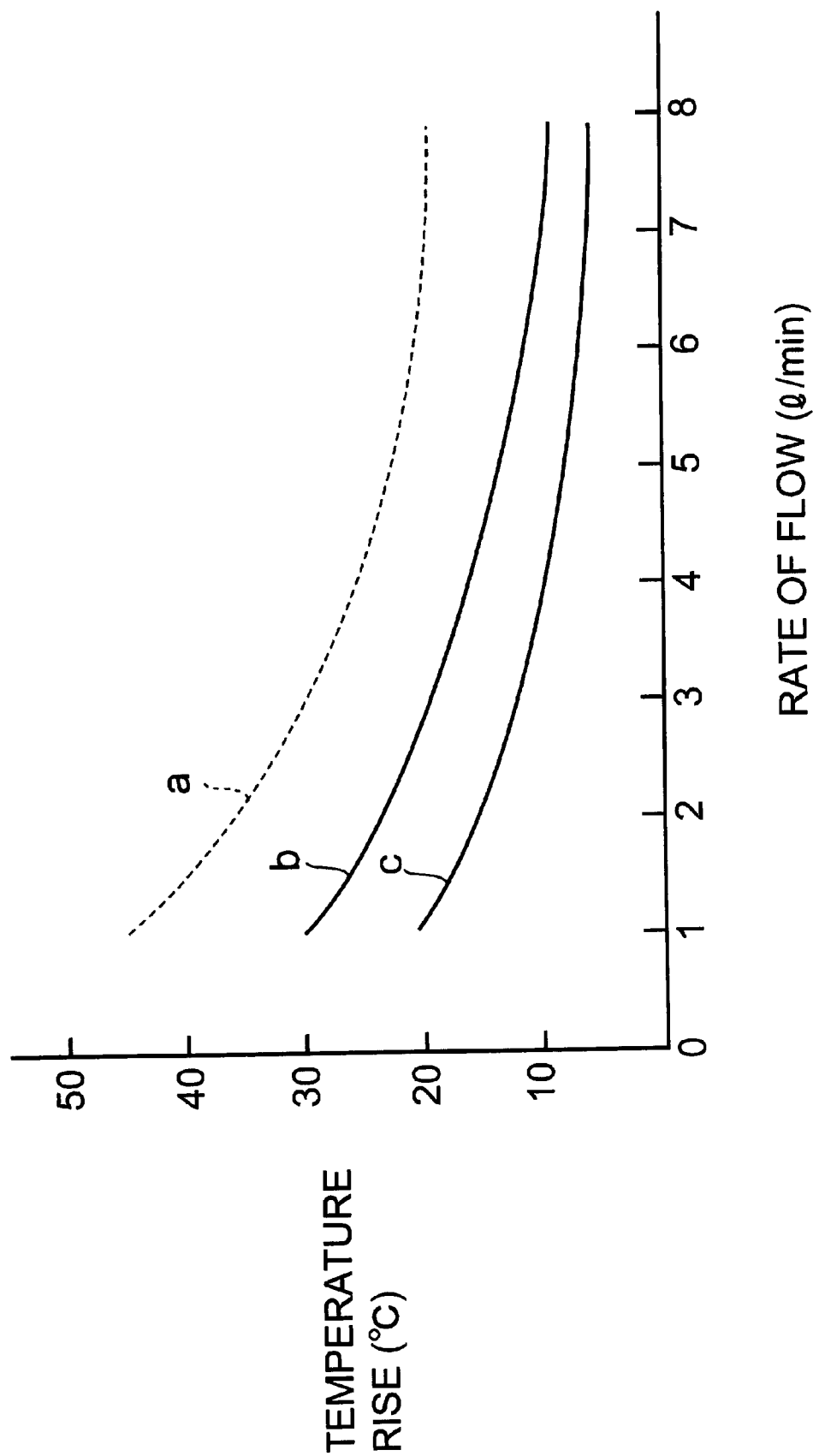

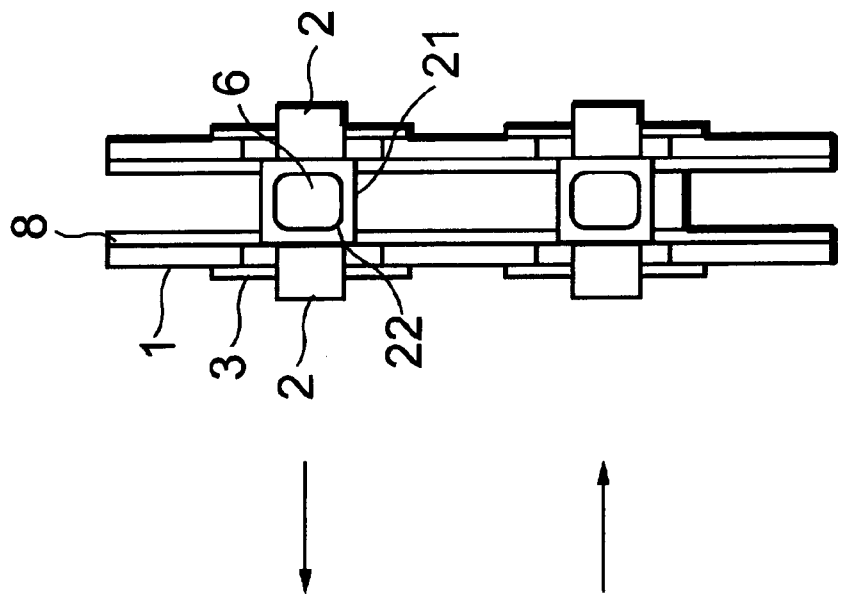
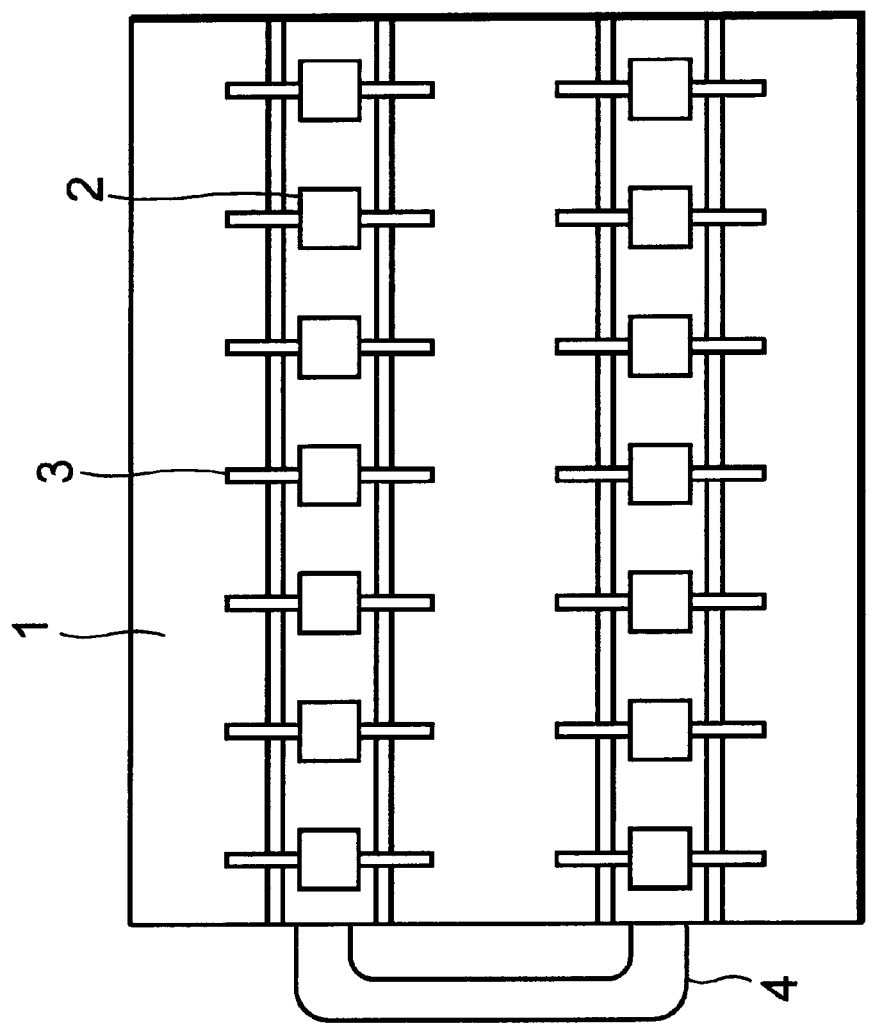

PRIOR ART FIG. 8A  FIG. 8B
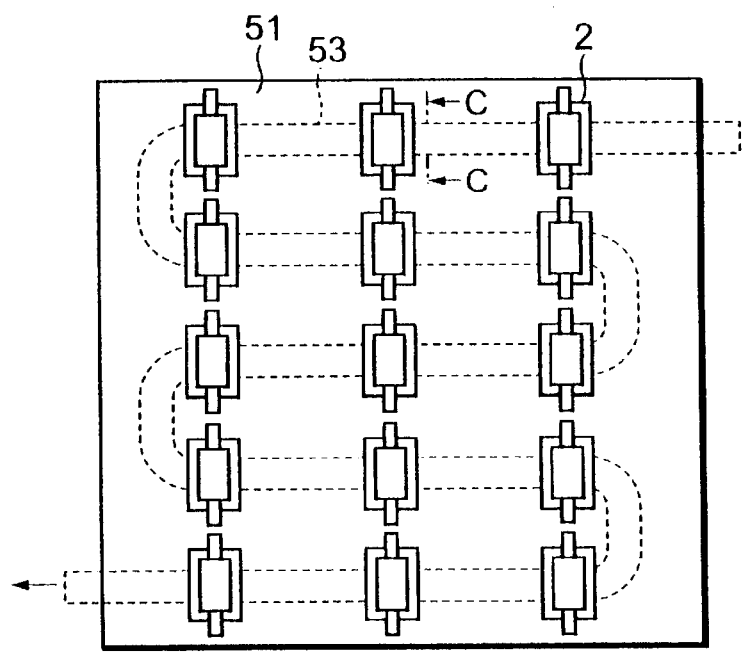
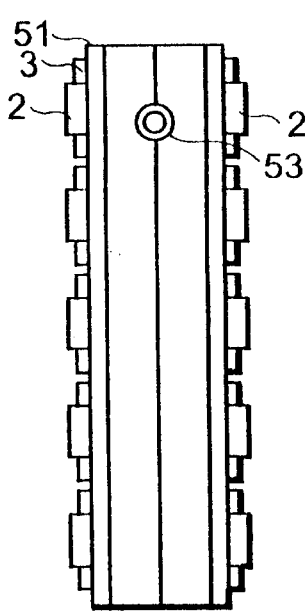
PRIOR ART
FIG. 8C
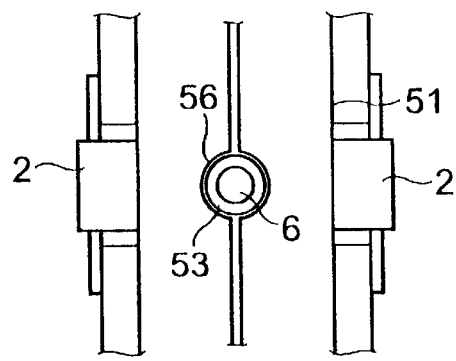
PRIOR ART

ADVANCED LIQUID COOLING APPARATUS

BACKGROUND OF THE INVENTION

1. Field of the Invention

The present invention relates to an advanced liquid cooling apparatus, and more specifically to a liquid cooling apparatus which circulates a liquid refrigerant around electronic equipment, such as a TV transmitter, which generates heat.

2. Description of the Related Art

In general, an electronic apparatus such as a TV transmitter comprises multiple printed circuit boards on which many semiconductor devices are provided, in its own rack. A fan or a blower attached inside or outside the rack performs forced-air cooling for the printed circuit board.

In recent years, since many circuitry elements are integrated as large scale or mounted in high-density packaging, the density of the heating locations in the rack increases. Such apparatus frequently makes use of a liquid cooling method which provides a high heat exchange performance. For example, to transfer heat outside, a liquid refrigerant is provided and flows on a flat board (cold plate), on which circuitry elements are disposed.

As shown in FIG. 7, in a conventional cooling system, the liquid refrigerant circulates around an electronic apparatus 50, which generates heat, removing the heat from the electronic apparatus 50. In FIG. 7, reference numeral 50 denotes an electronic apparatus which generates heat; reference numeral 60 denotes a pump rack; and reference numeral 70 denotes a heat exchange unit to cool the liquid.

Reference numerals 51 and 52 denote cold plates in the electronic apparatus. Reference numerals 53 and 54 denote copper pipes in the cold plates 51 and 52. Reference numeral 55 denotes a pipe arrangement which is connected to a return pipe arrangement 83. Reference numeral 61 in a pump rack 60 denotes a tank which absorbs possible volume changes caused by the temperature change of the liquid refrigerant. Reference numeral 62 denotes a pump to send the liquid refrigerant to the electronic apparatus 50. Reference numeral 63 denotes a pipe which is used to connect a transmission pipe arrangement 81 to the pump 62. The reference numeral 64 is a pipe arrangement which is used to connect the tank 61 to the pump 62. Reference numeral 65 denotes a pipe arrangement which is used to connect the tank 61 to the return pipe arrangement 82.

Reference numeral 71 in the heat exchange unit 70 denotes a condenser which is used for heat exchange. Reference numeral 72 denotes a fan. Reference numeral 73 denotes a motor to rotate the fan 72. Reference numeral 74 denotes a pipe arrangement which is used to connect the return pipe arrangement 82 to the condenser 71. Reference numeral 75 denotes a pipe arrangement which is used to connect the condenser 71 to the return pipe arrangement 83.

FIG. 8 shows a detailed configuration of the cold plate 51 as shown in FIG. 7. In FIG. 8, reference numeral 2 denotes a semiconductor device such as a power transistor (a heating unit, hereinafter). Reference numeral 3 denotes a lead wire of the heating unit. Reference numeral 53 denotes a copper pipe in the cold plate 51. Reference numeral 56 denotes grease used for the radiation of heat, where the heat of the cold plate 51 is transmitted to the copper pipe 53.

In the above conventional cooling system using the cold plate, however, since the cold plate, the grease and the copper pipe lie therebetween, it becomes difficult to efficiently transfer the heat of the heating unit to the liquid refrigerant. Thereby, there is a problem that cooling operation cannot be done efficiently.

In addition, in the case where several heating units are placed in a dispersed manner, a large and heavy cold plate is necessary to cover the whole of the heating units. This requires an apparatus large in size.

Furthermore, when grease is coated between the copper pipe and the cold plate for efficient heat transfer, the grease becomes reduced due to age deterioration and, thus, air-layers are naturally generated. These air-layers increase the thermal resistance. Thereby, there is a problem that stability and reliability of the apparatus become low.

On the other hand, it is noted that grease for efficient heat transfer may be unnecessary when aluminum material which embodies the cold plate is cast around the copper pipe. This can solve the problem of the low stability and reliability of the above mentioned prior art. However, cast-made aluminum material is inferior by 25% in thermal conductivity in comparison to ordinary aluminum material. Therefore, this leads to another problem that the cooling efficiency further deteriorates.

SUMMARY OF THE INVENTION

Accordingly, the present invention addresses the above problems and provides an advanced liquid cooling apparatus having an advanced cooling characteristic with high stability and reliability.

The present invention provides an advanced liquid cooling system, which is small and light in weight.

The advanced liquid cooling apparatus according to the present invention comprises a base on which heating units are fixed, a liquid-passage hole provided in the base, through which liquid refrigerant is passed, thereby enhancing the cooling efficiency. Further, according to the present invention, the liquid-passage hole is arranged in a zigzag manner to cool heating units disposed on both sides of the base.

BRIEF DESCRIPTION OF DRAWINGS

Other features and advantages of the present invention will be made more apparent through the detailed description hereafter, especially when taken in conjunction with the accompanying drawings, wherein:

FIG. 2 shows the relation between the rate of flow and the temperature rise explaining the operation of the present invention;

FIGS. 4A and 4B are a plan view and a side view showing configurations of a third embodiment according to the present invention;

FIGS. 8A and 8B are a plan view and a side view showing conventional configurations of a cooling system; and FIG. 8C is a cross section of FIG. 8A along a line CC;

DETAILED DESCRIPTION OF THE PREFERRED EMBODIMENTS

Figure 1B:
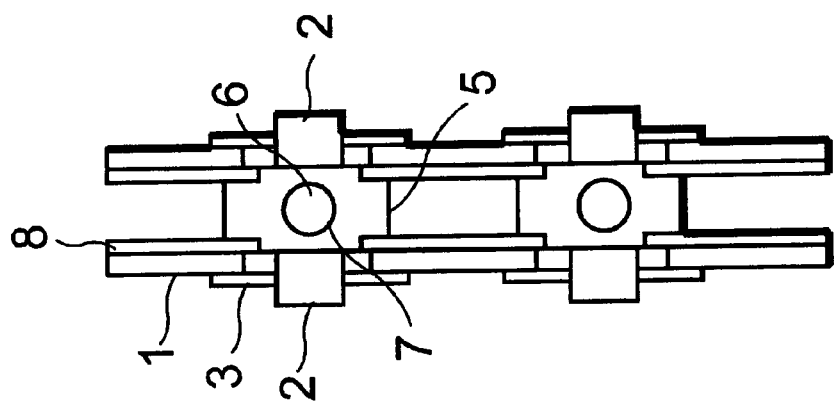
FIGS. 1A and 1B are a plan view and a side view showing configurations of a first embodiment according to the present invention.
Figure 1A:
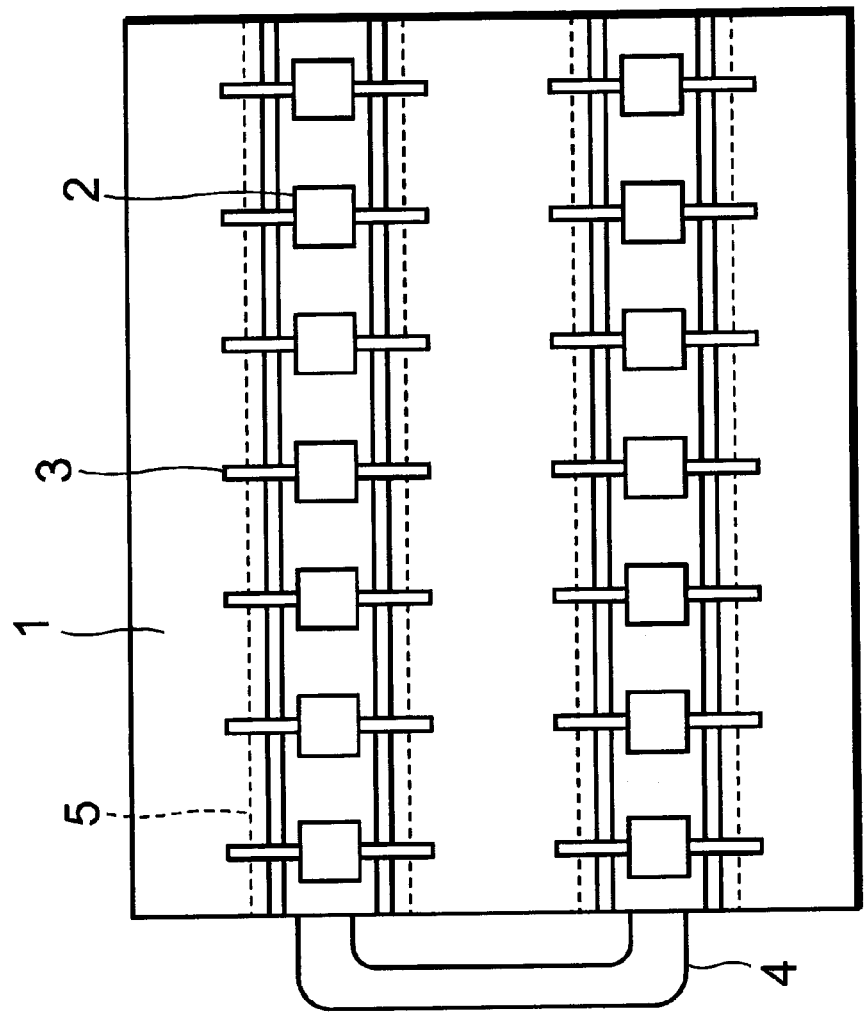

An embodiment of the present invention will be explained with reference to the drawings. With reference to FIGS. 1A and 1B showing configurations of the first embodiment according to the present invention, a lead wire 3 of a heating unit 2, which is a semiconductor device such as a power transistor, is soft-soldered on a printed circuit board 1, which accommodates a pattern of signal wiring (not shown in figures) and a ground pattern (not shown in figures). The heating unit 2 is contacted on a base 5, which has a high thermal conductivity. A liquid refrigerant 6 passes through a liquid-passage hole 7 in the base 5. In this embodiment, water is used for the liquid refrigerant 6.

Since the base 5 is made of copper having high thermal conductivity, and the liquid-passage hole 7 extends in vicinity of the heating unit 2 (in vicinity right under the heating unit 2), it is effective to transfer the heat of heating unit 2 to the liquid refrigerant 6. This enables control of the temperature rise of the heating unit to be maintained under a lower level.

In FIGS. 1A and 1B, the base 5 is fixed to a plate 8, and a ditch is prepared on the plate 8 to receive the base 5 on which the heating unit 2 is disposed. On the other hand, the printed circuit board 1 is disposed on the plate 8 and the lead wire 3 from the heating units 2 is connected to a circuit pattern on the printed circuit board 1. Two lines of the liquid-passage holes 7 in the base 5 are connected together by a connective pipe 4, and the liquid refrigerant 6 sent to one of the two water-passage holes 7, is drained out through the other of the two lines of water-passage holes 7.

With reference to FIG. 2 showing the result of the measurement of the rate of flow of the liquid refrigerant 6 versus the temperature rise in the heating unit, at the same rate of flow, the temperature rise (b) in the first embodiment is approximately half of that when the conventional cold plate (a) is used (see a and b in FIG. 2) while the copper base is used.

In the first embodiment where the copper base is used, by attaching the heating unit 2 along the water-passage hole 7 in a closed manner, it becomes possible to maintain the base 5 small in size and light in weight. Moreover, since the grease for the heat transfer is not necessary, no aged deterioration is expected and, thus, the stability and reliability is enhanced.

Figure 3A:
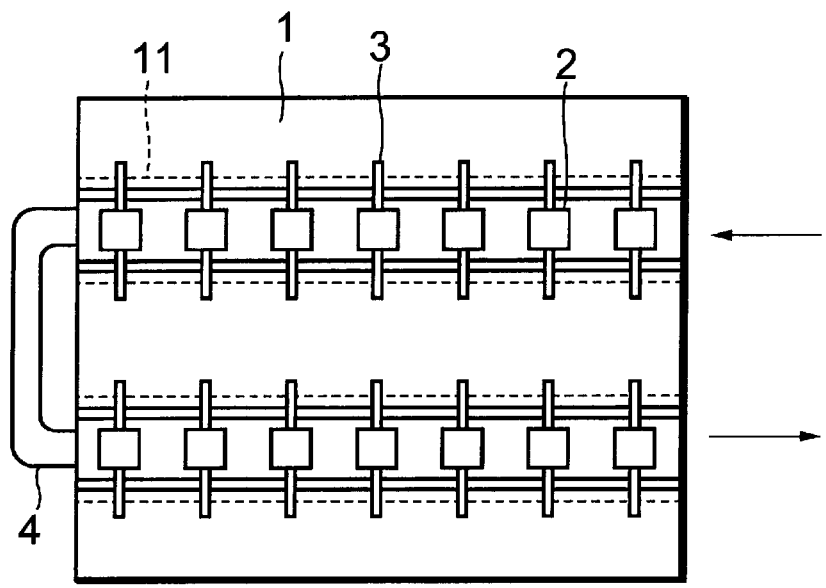
FIGS. 3A and 3B are a plan view and a side view showing configurations of a second embodiment according to the present invention.
Figure 3B:
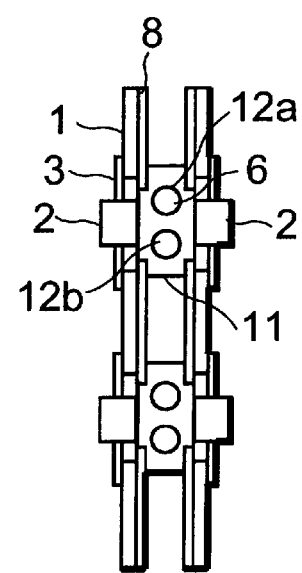

FIGS. 3A and 3B show a plan view and a side view of the configurations of a second embodiment according the present invention, respectively. The second embodiment has the same configuration as the first embodiment except that two additional liquid-passage holes 12a and 12b are provided in a base 11 having high thermal conductivity. In FIGS. 3A and 3B, the same reference numerals are attached to the identical elements of the first embodiment.

In the second embodiment of the present invention, the area sum of the cross sections of the two liquid-passage holes 12a and 12b prepared in the base 11 is the same as the area of the liquid-passage hole 7. By sending the liquid refrigerant 6 through the two water-passage holes 12a and 12b at the same rate of flow (flow speed) as that in the first embodiment, the thermal conductivity and the heat transferring area to the liquid refrigerant 6 can both be large.

FIGS. 4A and 4B show a plan view and a side view of the configuration of a third embodiment according to the present invention, respectively. The third embodiment has the same configuration as the first embodiment except that a square pipe 21 is provided in place of the base 5 of the first embodiment. In FIGS. 4A and 4B, the same reference numerals are attached to the identical elements of the first embodiment.

In the third embodiment, by sending the liquid refrigerant 6 through he square pipe 21, the heating unit 2 can be cooled in the same manner as done by the first embodiment of the present invention. In this case, it is not necessary to use the base 5 shown in FIGS. 1A and 1B, which the base 5 requires complicated cutting-process to make it. Accordingly, productivity is remarkably improved.

Figure 5B:
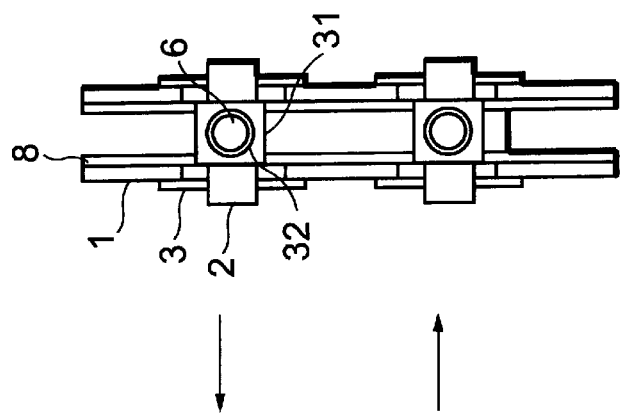
FIGS. 5A and 5B are a plan view and a side view showing configurations of a fourth embodiment according to the present invention.
Figure 5A:
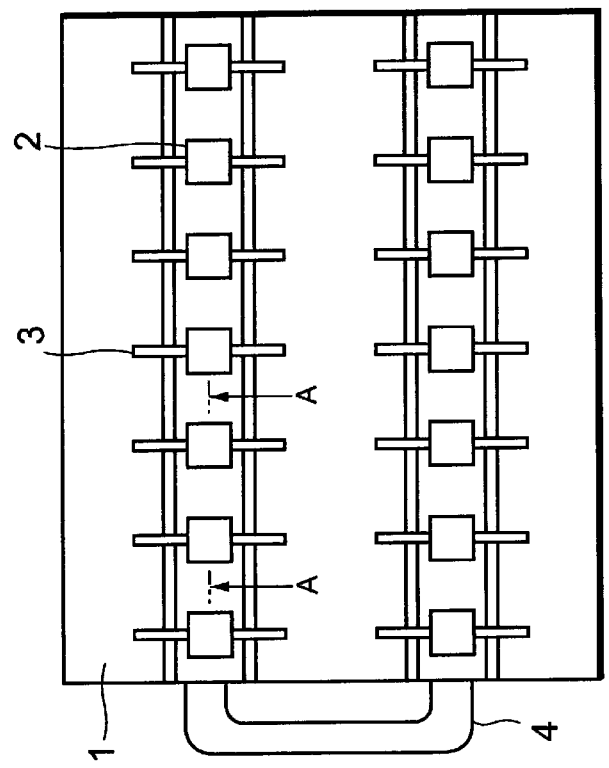
Figure 5C:
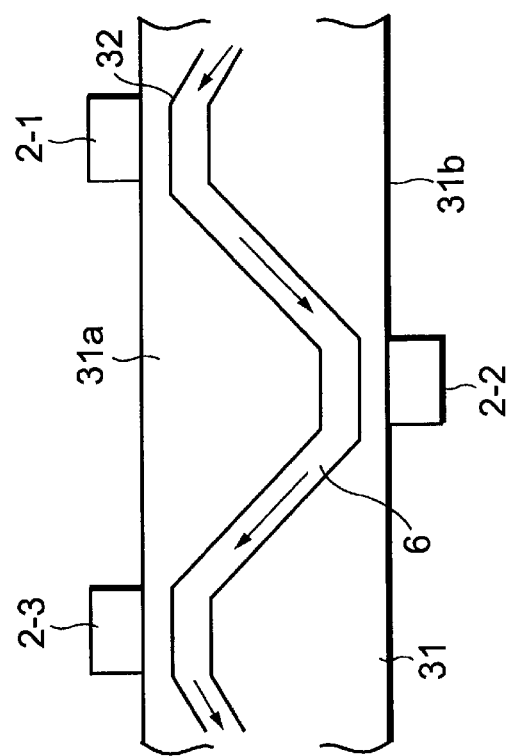
FIG. 5C is a cross section of FIG. 5A along a line AA.

FIGS. 5A, 5B, and 5C show a configuration of a fourth embodiment according to the present invention, i.e., a plan view, a side view and a cross section along the line AA in FIG. 5A. The fourth embodiment has the same configuration as the first embodiment except that the heating units 2 are fixed on the front side and the back side of a base 31 in a zigzag manner so that it become possible to locate the adjacent heating units 2 more closely. In the fourth embodiment, a liquid-passage hole 32 is also prepared in the base 31 in a zigzag manner. In detail, refering to FIG. 5C, the liquid-passage hole 32 runs in the vicinity of the contact surface of the heating unit 2-1, fixed on the surface 31a of the base 31 and, after this, runs in the vicinity of the contact surface of the heating unit 2-2, fixed on the back side of the base 31 and, then, runs in the vicinity of the contact surface of the heating unit 2-3, fixed on surface 31a of the base 31.

In addition, according to the fourth embodiment, in the vicinity of the contact surface of the heating units 2-1 to 2-3, the liquid-passage hole 32 is shaped in parallel with both the front surface 31a and the back side 31b of the base 31. With this configuration, the liquid refrigerant 6 flowing through the liquid-passage hole 32 collides with the inside of the base 31 in the vicinity of the contact surface of the heating units 2-1 to 2-3. This improves the thermal conductivity and makes the cooling efficiency high.

Figure 6B:
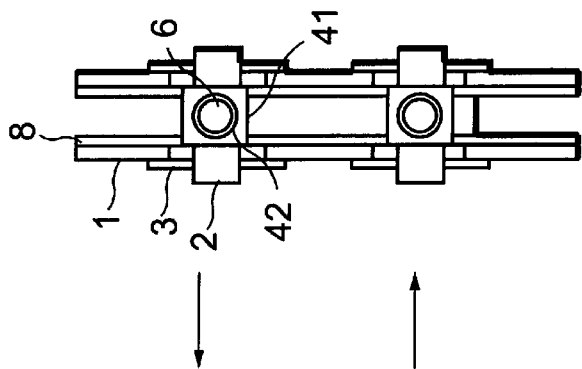
FIGS. 6A and 6B are a plan view and a side view showing configurations of a fifth embodiment according to the present invention.
Figure 6A:
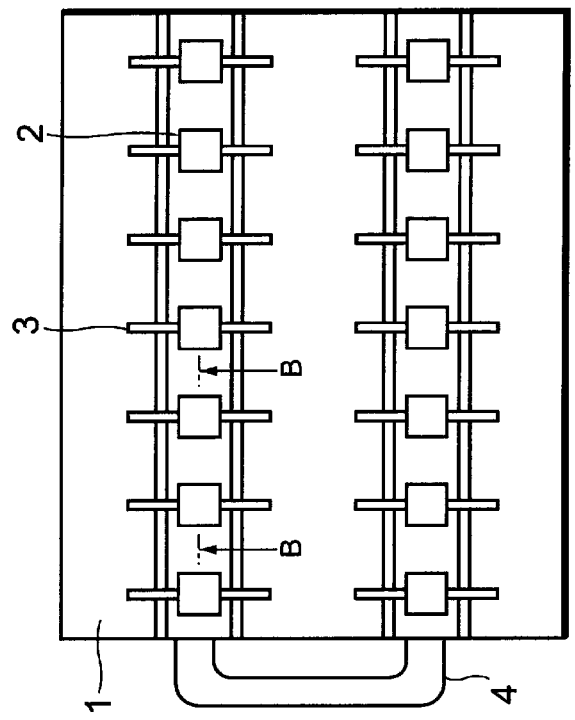
Figure 6C:
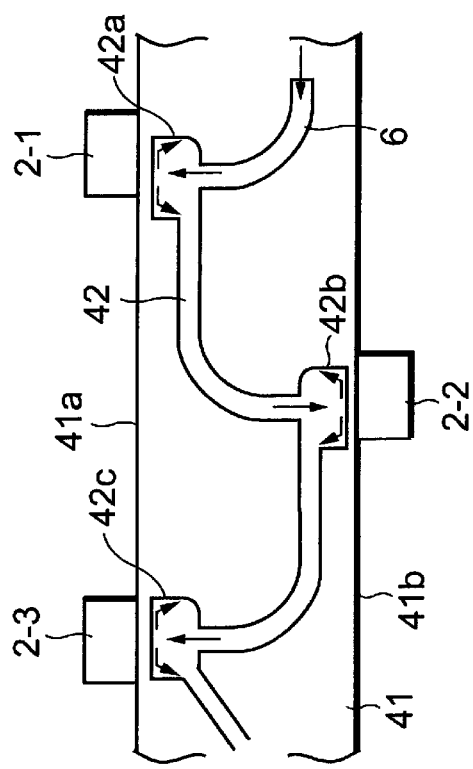
FIG. 6C is a cross section of FIG. 6A along a line BB.

FIGS. 6A, 6B and 6C show the configuration of a fifth embodiment according to the present invention. In FIGS. 6A and 6B showing a plan view, a side view and a cross section along a line BB of FIG. 6A, the configuration has the same configuration of the first embodiment except that reservoirs (or chambers) 42a to 42c are provided in a base 41 in the vicinity of the contact surface of the heating units 2-1 to 2-3 and a liquid-passage hole 42 are arranged so that the liquid refrigerant 6 perpendicularly collides with the inside of the base 41 at the reservoirs 42a to 42c. In the fifth embodiment, the liquid-passage hole 42 in the base 41 is also arranged as the same as the fourth embodiment.

In addition, the inside of the reservoirs 42a to 42c in the base 41 are shaped in parallel with both the front side 41a and the back side 41b of the base 41, so that the liquid refrigerant 6 flowing through the liquid-passage hole 42 perpendicularly collides with the inside wall of the reservoirs 42a to 42c, where the heating units 2-1 to 2-3 are located. Therefore, the thermal conductivity is further enhanced more than that of the fourth embodiment of the present invention, and the cooling efficiency is further enhanced.

In the above configuration, the size of the cross section of the liquid-passage hole 42 connecting between the reservoirs 42a to 42c, is decreased in comparison with the size of the reservoirs 42a to 42c. Thereby, the liquid refrigerant 6 flows faster through the liquid-passage hole 42, and accordingly, the liquid refrigerant 6 collides with the inside wall of the reservoirs 42a to 42c while the speed of flow of the liquid refrigerant 6 is increased, thereby improving the thermal conductivity.

In FIG. 2, with the fifth embodiment of the present invention utilizing The collision base, the temperature rise goes down to less than half while the ate of flow is reduced by a half, in comparison with the conventional cold late type (see a and c in FIG. 2).

It is noted that, in the above embodiments (the first to the fifth embodiments), the bases 5, 11, 21, 31, 41 are made of copper, having high thermal conductivity. However, the material of the base is not limited to copper, and any material having high thermal conductivity, such as aluminum can be used alternatively.

Furthermore, by processing insides of the liquid-passage holes 7, 12a, 12b, 22, 32, and 42 by a knurling tool, notches (bumps) are made in the water-passage hole 7, 12a, 12b, 22, 32, and 42 so that the surface area is increased. Thereby, the cooling efficiency is further enhanced.

As described above, by providing the liquid-passage holes 7, 12a, 12b, 22, 32, and 42 in the base 5, 11, 21, 31, and 41, on which the heating units 2 are placed, and by allowing the liquid refrigerant 6 to flow through the liquid-passage holes, the cooling efficiency is enhanced. Further, it is better to optimize the configuration so that the thermal conductivity is more improved. To this end, it is preferable to use the base made of material having high thermal conductivity such as aluminum and copper, to enlarge an area of contacting surfaces where the liquid refrigerant contacts the bases, and to increase the flow speed of the liquid refrigerant in the liquid-passage holes. In addition, the liquid-passage holes are so arranged to run in the base in the zigzag manner that the liquid refrigerant 6 collides with the inside of the base at locations in the vicinity of the contact surfaces of the heating units 2, thereby locally providing a high thermal conductivity at the locations where the heating units are disposed.

To optimize the size and shape of the cross sections of the liquid-passage holes, there is a constraint that follows among the temperature rise $\Delta T$ in the bases, a calorific value Q, a thermal conductivity hc, and a contacting surface area A where the liquid refrigerant contacts the base:

$$\Delta T = Q/(hc \times A)$$

To lower the temperature rise, the thermal conductivity needs to be improved by enlarging the surface area or increasing the flow speed of the liquid refrigerant. To attain this, it is necessary to increase the number of the liquid-passage holes and/or to form notches or knurls in the liquid-passage holes.

Allowing the liquid refrigerant to collide with the base in the vicinity of the contact surface of the heating units, in other words, utilizing the thermal transfer by using jet collision, provides a high thermal conductivity at pinpoint on a base. About the jet collision using the liquid refrigerant, it is experimentally known that the temperature rise becomes less than half even when the flow speed of the liquid refrigerant is set half. Namely, in other words, four-times cooling efficiency is obtained, as compared to the conventional cold plate type cooling system. Accordingly, a comparatively small capacity power source is allowed for use. Moreover, there is a benefit that the thermal conductivity can be easily adjusted or regulated by controlling the flow speed of the liquid refrigerant.

According to the present invention as explained above, the advanced liquid cooling apparatus comprising the base on which heating units are fixed and a liquid-passage hole arranged in the base, is provided. With this configuration, there is a benefit that the cooling characteristics and stability/reliability are enhanced and thus the cooling apparatus can be made small in size and light in weight.

Figure 7:
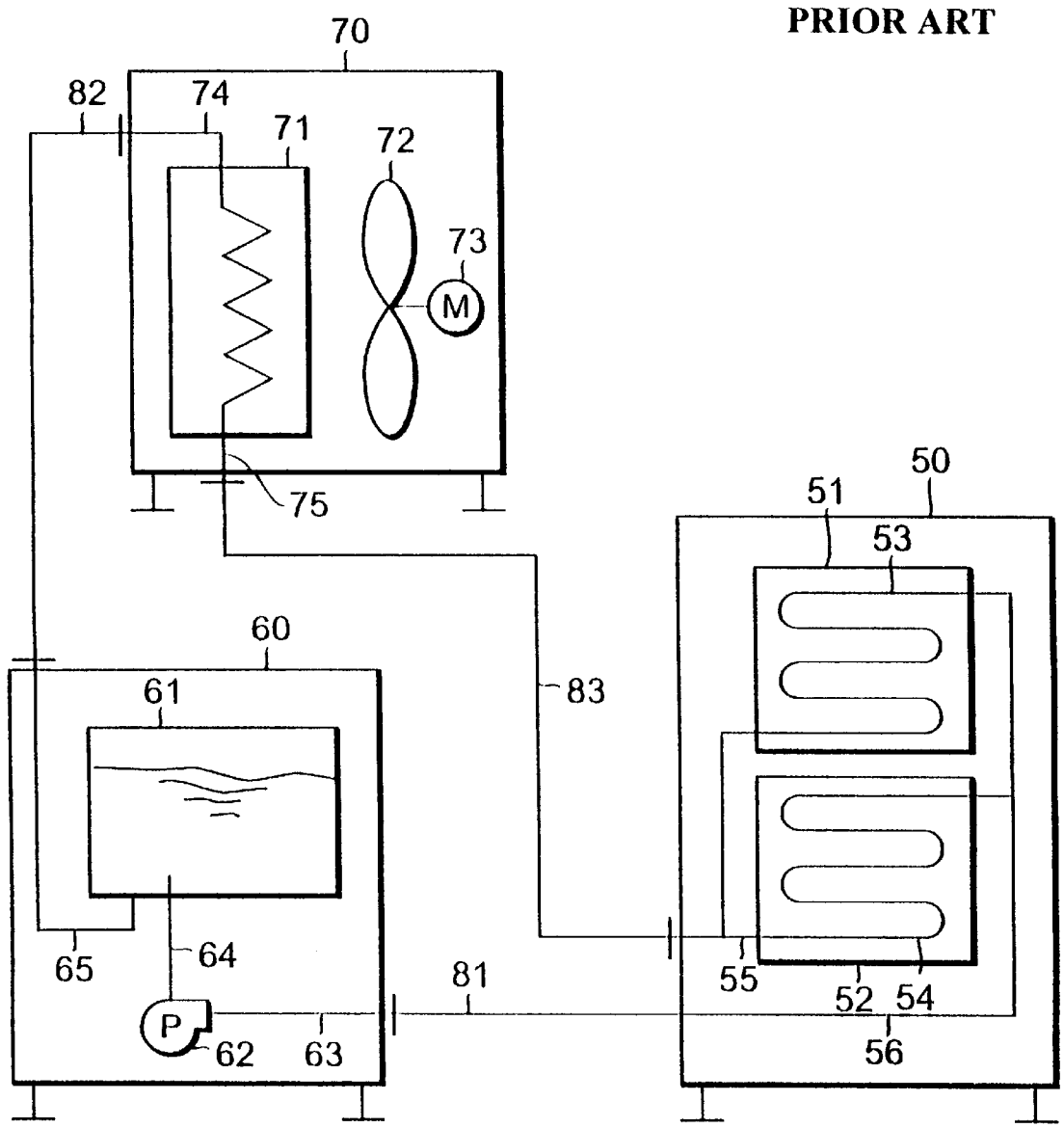
FIG. 7 shows a configuration of the conventional cooling system.

The advanced liquid cooling apparatus according to the present invention can be applied to a liquid cooling system as shown in FIG. 7, instead of the conventional cold plate 51 and 52.

While the present invention has been described in connection with certain preferred embodiments, it is understood that the subject matter encompassed by the present invention is not limited to those specific embodiments. On the contrary, it is intended to include all alternatives, modifications, and equivalents as can be included within the spirit and scope of the following claims.

What is claimed is:

1. A liquid cooling apparatus comprising:
 a heat exchange unit;
 a pump for circulating liquid refrigerant;
 a tank for storing said liquid refrigerant;
 a base on which a plurality of heating units is disposed;
 liquid-passage conduit provided in said base to allow liquid refrigerant to pass through; and
 pipe arrangement for transporting said refrigerant through said heat exchange unit, liquid-passage conduit, pump, and tank, wherein
 said heating units are disposed on opposite sides of said base in a zigzag manner and said liquid-passage conduit is provided in said base in a corresponding zigzag pattern so that said liquid refrigerant flows at locations in a vicinity of said heating units disposed on said opposite sides of said base.

2. A liquid cooling apparatus according to claim 1, wherein said base is a square shaped pipe.

3. A liquid cooling apparatus according to claim 1, wherein a plurality of liquid-passage conduits is provided in said base.

4. A liquid cooling apparatus according to claim 1, wherein said liquid refrigerant collides with an inside wall of said base at turning points of said liquid passage conduit.

5. A liquid cooling apparatus according to claim 4, further comprising reservoirs at said turning points of said liquid-passage conduit, said reservoirs receiving said liquid refrigerant.

6. A liquid cooling apparatus according to claim 5, wherein said reservoirs are located at corresponding positions of said heating units.

7. A liquid cooling apparatus according to claim 5, wherein said liquid refrigerant is jetted toward said heating unit in said reservoir.

8. A liquid cooling apparatus according to claim 5, wherein a cross section size of said reservoir is larger than a cross section size of said liquid-passage conduit connecting said reservoirs.

9. A liquid cooling apparatus according to claim 1, wherein portions of said liquid-passage conduit are arranged in parallel with a surface of said base at locations adjacent said heating units disposed on said opposing sides of said base.

10. A liquid cooling apparatus according to claim 1, further comprising a supporting plate having an opening to receive said base and to make contact with said heating units on said base.

* * * * *